(12) United States Patent
Baik

(10) Patent No.: US 12,389,759 B2
(45) Date of Patent: Aug. 12, 2025

(54) ELECTROLUMINESCENCE DISPLAY

(71) Applicant: LG Display Co., Ltd., Seoul (KR)

(72) Inventor: SeungMin Baik, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 527 days.

(21) Appl. No.: 17/896,880

(22) Filed: Aug. 26, 2022

(65) Prior Publication Data

US 2023/0200148 A1 Jun. 22, 2023

(30) Foreign Application Priority Data

Dec. 21, 2021 (KR) .................. 10-2021-0183982

(51) Int. Cl.
*G09G 3/3233* (2016.01)
*H10K 50/822* (2023.01)
*H10K 59/124* (2023.01)
*H10K 59/122* (2023.01)

(52) U.S. Cl.
CPC ......... *H10K 59/124* (2023.02); *G09G 3/3233* (2013.01); *H10K 50/822* (2023.02); *G09G 2300/0842* (2013.01); *H10K 59/122* (2023.02)

(58) Field of Classification Search
None
See application file for complete search history.

(56) References Cited

U.S. PATENT DOCUMENTS

| | | | | |
|---|---|---|---|---|
| 5,669,801 A | * | 9/1997 | Lee | H01J 9/025 445/24 |
| 5,871,383 A | * | 2/1999 | Levine | H01J 29/085 445/24 |
| 6,091,078 A | * | 7/2000 | Codama | H05B 33/02 313/506 |
| 2002/0105265 A1 | * | 8/2002 | Chuang | H10K 59/00 313/506 |
| 2022/0131104 A1 | | 4/2022 | Kim et al. | |

* cited by examiner

*Primary Examiner* — Bilkis Jahan
(74) *Attorney, Agent, or Firm* — Birch, Stewart, Kolasch & Birch, LLP

(57) ABSTRACT

An electroluminescence display can include a substrate including a first pixel at a first row and a first column, a second pixel at the first row and a second column, a third pixel at a second row and the first column, and a fourth pixel at the second row and the second column, a first vertical trench between the first pixel and the second pixel, a second vertical trench between the third pixel and the fourth pixel, a first horizontal trench between the first pixel and the third pixel, a second horizontal trench between the second pixel and the fourth pixel, and a protrusion pillar at an intersection portion of the substrate where the first vertical trench, the second vertical trench, the first horizontal trench, and the second horizontal trench converge.

20 Claims, 11 Drawing Sheets

ELECTROLUMINESCENCE DISPLAY

CROSS-REFERENCE TO RELATED APPLICATIONS

This application claims the benefit of priority to the Korean Patent Application No. 10-2021-0183982 filed in the Republic of Korea on Dec. 21, 2021, the entire contents of which are hereby expressly incorporated by reference into the present application.

BACKGROUND OF THE DISCLOSURE

Field of the Invention

The present disclosure relates to an electroluminescence display. In particular, the present disclosure relates to an electroluminescence display having a structure that prevents or reduces the lateral (or horizontal) leakage current occurring between neighboring pixels in the ultra-high resolution of pixel array.

Discussion of the Related Art

Recently, various type of display have been developed, such as the cathode ray tubes (CRTs), the liquid crystal displays (LCDs), the plasma display panels (PDPs) and the electroluminescent displays. These various types of display can be used to display image data of various products such as computer, mobile phones, bank deposit and withdrawal devices (ATMs), and vehicle navigation systems according to their specific characteristics and purposes.

In particular, the electroluminescent display is a self-luminous display, and has a structure in which a plurality of pixel areas including light emitting diodes are arranged. As the density of pixels increases, the distance between pixels becomes closer, and the distortion of pixel information can occur due to the lateral leakage current between pixels adjacent to each other in the lateral (or horizontal) direction. In order to ensure excellent display quality, it is necessary to develop a structure for an electroluminescence display that is capable of suppressing a lateral leakage current between neighboring pixels.

SUMMARY OF THE DISCLOSURE

An object to be achieved by embodiments of the present disclosure is to provide an electroluminescence display capable of preventing or reducing display quality degradation due to the leakage current in a lateral direction as a distance between pixels in a display device having a high pixel density becomes narrower. In particular, the purpose of the present disclosure is to prevent or reduce image quality distortion by forming a trench surrounding all sides of the pixel in a plane view to block the lateral leakage current in longitudinal direction and transverse direction. Another purpose of the present disclosure is to prevent or reduce leakage current generated as the width of the trench increases in a portion where a horizontal trench extending along a horizontal direction and a vertical trench extending along a vertical direction are intersected.

In order to accomplish the above mentioned purposes of the embodiments of the present disclosure, an electroluminescence display according to the present disclosure can include a first pixel disposed at 1st row-1st column, a second pixel disposed at 1st row-2nd column, a third pixel disposed at 2nd row-1st column, and a fourth pixel disposed at 2nd row-2nd column on a substrate; a first vertical trench disposed between the first pixel and the second pixel; a second vertical trench disposed between the third pixel and the fourth pixel; a first horizontal trench disposed between the first pixel and the third pixel; a second horizontal trench disposed between the second pixel and the fourth pixel; and a protrusion pillar disposed at an intersection portion where the first vertical trench and the second vertical trench face, and the first horizontal trench and the second horizontal trench face.

In one embodiment of the present disclosure, the electroluminescence display can further include a first emission layer disposed at the first pixel to the fourth pixel, disconnected by the first vertical trench, the second vertical trench, the first horizontal trench and the second horizontal trench, and connected passing over the protrusion pillar; a charge generation layer disposed on the first emission layer, disconnected by the first vertical trench, the second vertical trench, the first horizontal trench and the second horizontal trench, and connected passing over the protrusion pillar; and a second emission layer on the charge generation layer, and connected passing over the first vertical trench, the second vertical trench, the first horizontal trench, the second horizontal trench, and the protrusion pillar.

In one embodiment, the electroluminescence display can further include a plurality of first electrodes, each of the first electrode disposing at first pixel to fourth pixel; and a second electrode disposed on the second emission layer, and connected passing over the first vertical trench, the second vertical trench, the first horizontal trench, the second horizontal trench, and the protrusion pillar.

In one embodiment, the protrusion pillar has a rectangular shape including four sides corresponding to a width of the first vertical trench, the second vertical trench, the first horizontal trench and the second horizontal trench.

In one embodiment, the protrusion pillar is a '+' shaped pillar having protruding lengths from the rectangular shape in directions of the first vertical trench, the second vertical trench, the first horizontal trench and the second horizontal trench.

In one embodiment, a ratio of the protruding length in the direction of the first vertical trench from the rectangular shape and a length of the first vertical trench has any one value selected from 1:8 to 0:10. A ratio of the protruding length in the direction of the first horizontal trench from the rectangular shape and a length of the first horizontal trench has any one value selected from 1:8 to 0:10.

In addition, an electroluminescence display according to the present disclosure can include a substrate; a planarization layer on a whole surface of the substrate; a first electrode disposed on the planarization layer and including a first side, a second side perpendicular to the first side, and an intersection portion intersecting the first side and the second side; a trench disposed at outside of the first side and the second side, and having a predetermined width; a protrusion pillar disposed at the intersection portion; a first emission layer disposed on the first electrode, disconnected by the trench, and connected passing over the protrusion pillar; a charge generation layer disposed on the first emission layer, disconnected by the trench, and connected passing over the protrusion pillar; a second emission layer disposed on the charge generation layer, connected passing over the trench, and connected passing over the protrusion pillar; and a second electrode disposed on the second emission layer, connected passing over the trench and the pillar.

In one embodiment, the charge generation layer is electrically disconnected from the cathode electrode.

In one embodiment, the first electrode further includes a third side parallel to the first side; and a fourth side parallel to the second side. The trench includes a first trench disposed outside the first side and the third side; and a second trench disposed outside the second side and the fourth side.

In one embodiment, the electroluminescence display can further include a bank covering the first side, the second side, the third side and the fourth side of the first electrode, and exposing a central portion of the first pixel. The trench is formed by removing the bank and the planarization layer with a predetermined depth.

In one embodiment, the protrusion pillar is formed on an upper surface of the bank disposed at the intersection portion.

In one embodiment, the bank includes a first bank; and a second bank disposed on the first bank.

In one embodiment, the trench includes a first trench disposed outside the first side and corresponding to the first side; a second trench disposed outside the second side and corresponding to the second side; a third trench disposed outside the third side and corresponding to the third side; and a fourth trench disposed outside the fourth side and corresponding to the fourth side. The protrusion pillar includes four sides corresponding to the width of the trench at the intersection portion.

In one embodiment, the protrusion pillar has a '+' shaped pillar protruding toward the first side and the second side from the intersection portion.

In one embodiment, a ratio of (a first protrusion length protruding from the protrusion pillar disposed at one end of the first horizontal trench toward the first horizontal trench):(a length of the first horizontal trench):(a second protrusion length protruding from the protrusion pillar PRL disposed at the other end of the first horizontal trench toward the first horizontal trench) has any one of 1:8:1 to 0:10:0.

The electroluminescent display according to the present disclosure includes a trench structure surrounding each pixel in a plane view. In particular, a vertical trench running in a longitudinal direction and a horizontal trench running in a transverse direction are provided. Therefore, the charge generation layer of the organic emission layer stacked on the entire surface of the substrate can have a structure in which electrical connectivity is disconnected in a transverse (or horizontal) direction and a longitudinal (or vertical) direction in a plane view. As a result, image distortion due to the lateral leakage current between neighboring pixels can be prevented or reduced. In the trench arrangement having the net structure as described above, the width of the trench can be wide at the intersection portion. At the intersection portion where the trench width is wider than other portions, the charge generation layer of the organic emission layer can be connected to the cathode electrode, so that a pixel defect can occur. However, in the present disclosure, since the barrier rib structure is formed at the intersection of the trench arrangement, the charge generation layer of the organic emission layer can have a structure of high electrical resistance between neighboring pixels. Accordingly, it is possible to provide excellent image information by blocking lateral leakage current in all directions in the electroluminescence display having an ultra-high resolution structure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
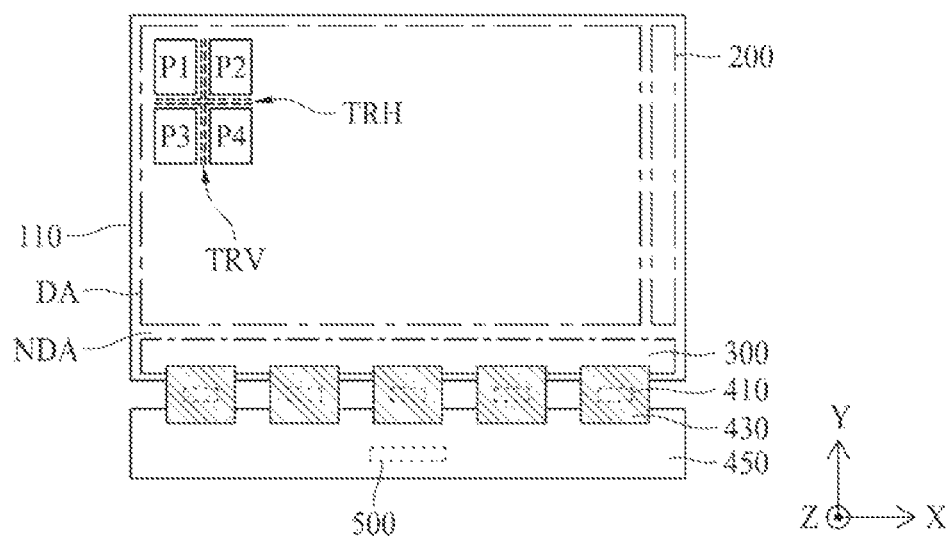
FIG. 1 is a plane view illustrating a schematic structure of an electroluminescence display according to an embodiment of the present disclosure.

Advantages and features of the embodiments of present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

Reference will now be made in detail to the example embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the instance that "comprise," "have," and "include" described in the present specification are used, another part can also be present unless "only" is used. The terms in a singular form can include plural forms unless noted to the contrary.

In construing an element, the element is construed as including an error range or a reasonable range although there may not be an explicit description.

In describing a positional relationship, for example, when the positional order is described as "on," "above," "below," and "next," the instance of no contact there-between can be included, unless "just" or "direct" is used. If it is mentioned that a first element is positioned "on" a second element, it does not necessarily mean that the first element is essentially positioned above the second element in the figure. The upper part and the lower part of an object concerned can be changed depending on the orientation of the object. Consequently, the instance in which a first element is positioned "on" a second element includes the instance in which the first element is positioned "below" the second element as well as the instance in which the first element is positioned "above" the second element in the figure or in an actual configuration.

In describing a temporal relationship, for example, when the temporal order is described as "after," "subsequent," "next," and "before," an instance which is not continuous can be included, unless "just" or "direct" is used.

It will be understood that, although the terms "first," "second," etc., can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) can be used. These terms are only to distinguish the elements from other elements, and the terns are not limited in nature, order, sequence or number of the elements. When an element is described as being "linked", "coupled" or "connected" to another element that element can be directly connected to or connected to that other element, but indirectly unless otherwise specified. It is to be understood that other elements can be "interposed" between each element that can be connected to or coupled to.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, an example of a display apparatus according to the present disclosure will be described in detail with reference to the accompanying drawings. In designating reference numerals to elements of each drawing, the same components can have the same reference numerals as much as possible even though they are shown in different drawings. Scale of the elements shown in the accompanying drawings can have a different scale from the actual for convenience of description, and each element is not limited to the scale shown in the drawings.

Hereinafter, referring to attached figures, an explanation about the present disclosure is provided in detail. FIG. 1 is a diagram illustrating a schematic structure of an electroluminescence display according to the present disclosure. In FIG. 1, X-axis can be parallel to the extending direction of the scan line, Y-axis can be parallel to the extending direction of the data line, and Z-axis can represent the thickness direction of the display. All components of each electroluminescence emitting display according to all embodiments of the present disclosure are operatively coupled and configured.

Referring to FIG. 1, the electroluminescence display can include a substrate 110, a gate (or scan) driver 200, a data pad portion 300, a source driving IC (Integrated Circuit) 410, a flexible film 430, a circuit board 450, and a timing controller 500.

The substrate 110 can include an electrical insulating material or a flexible material. The substrate 110 can be made of a glass, a metal or a plastic, but it is not limited thereto. When the electroluminescence display is a flexible display, the substrate 110 can be made of the flexible material such as plastic. For example, the substrate 110 can include a transparent polyimide material.

The substrate 110 can include a display area DA and a non-display area NDA. The display area DA, which is an area for representing or displaying the video images, can be defined as the majority middle area of the substrate 110, but it is not limited thereto. In the display area DA, a plurality of scan lines (or gate lines), a plurality of data lines and a plurality of pixels P1, P2, P3 and P4 can be formed or disposed. Each of pixels can include a plurality of sub pixels. Each of sub pixels can include the scan line and the data line, respectively.

The non-display area NDA, which is an area not representing or displaying the video images, can be defined at the circumference areas of the substrate 110 surrounding all or some of the display area DA. In the non-display area NDA, the gate driver 200 and the data pad portion 300 can be formed or disposed therein.

The gate driver 200 can supply the scan (or gate) signals to the scan lines according to the gate control signal received from the timing controller 500. The gate driver 200 can be formed at the non-display area NDA at any one outside of the display area DA on the substrate 110, as a GIP (Gate driver In Panel) type. GIP type means that the gate driver 210 is directly formed on the substrate 110.

The data pad portion 300 can supply the data signals to the data line according to the data control signal received from the timing controller 500. The data pad portion 300 can be made as a driver chip and mounted on the flexible film 430.

Further, the flexible film 430 can be attached at the non-display area NDA at any one outside of the display area DA on the substrate 110, as a TAB (Tape Automated Bonding) type.

The source driving IC 410 can receive the digital video data and the source control signal from the timing controller 500. The source driving IC 410 can convert the digital video data into the analog data voltages according to the source control signal and then supply that to the data lines. When the source driving IC 410 is made as a chip type, it can be installed on the flexible film 430 as a COF (Chip On Film) or COP (Chip On Plastic) type.

The flexible film 430 can include a plurality of first link lines connecting the data pad portion 300 to the source driving IC 410, and a plurality of second link lines connecting the data pad portion 300 to the circuit board 450. The flexible film 430 can be attached on the data pad portion 300 using an anisotropic conducting film, so that the data pad portion 300 can be connected to the first link lines of the flexible film 430.

The circuit board 450 can be attached to the flexible film 430. The circuit board 450 can include a plurality of circuits implemented as the driving chips. For example, the circuit board 450 can be a printed circuit board or a flexible printed circuit board.

The timing controller 500 can receive the digital video data and the timing signal from an external system board through the line cables of the circuit board 450. The timing controller 500 can generate a gate control signal for controlling the operation timing of the gate driver 200 and a source control signal for controlling the source driving IC 410, based on the timing signal. The timing controller 500 can supply the gate control signal to the gate driver 200 and supply the source control signal to the source driving IC 410. Depending on the product types, the timing controller 500 can be formed as one chip with the source driving IC 410 and mounted on the substrate 110.

First Embodiment

Figure 2:
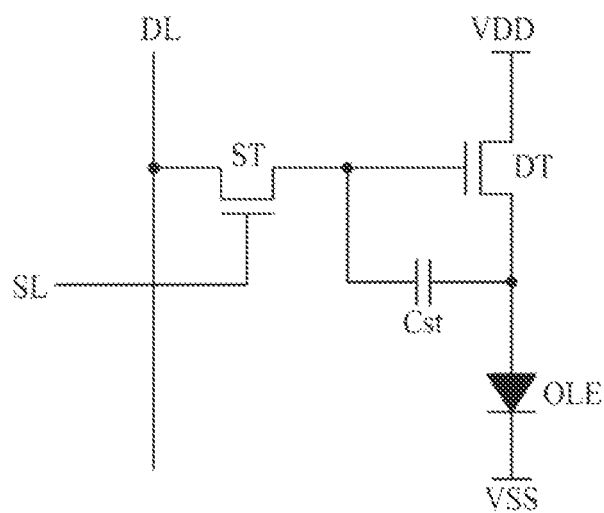
FIG. 2 is a circuit diagram illustrating a structure of one pixel according to an embodiment of the present disclosure.
Figure 3:
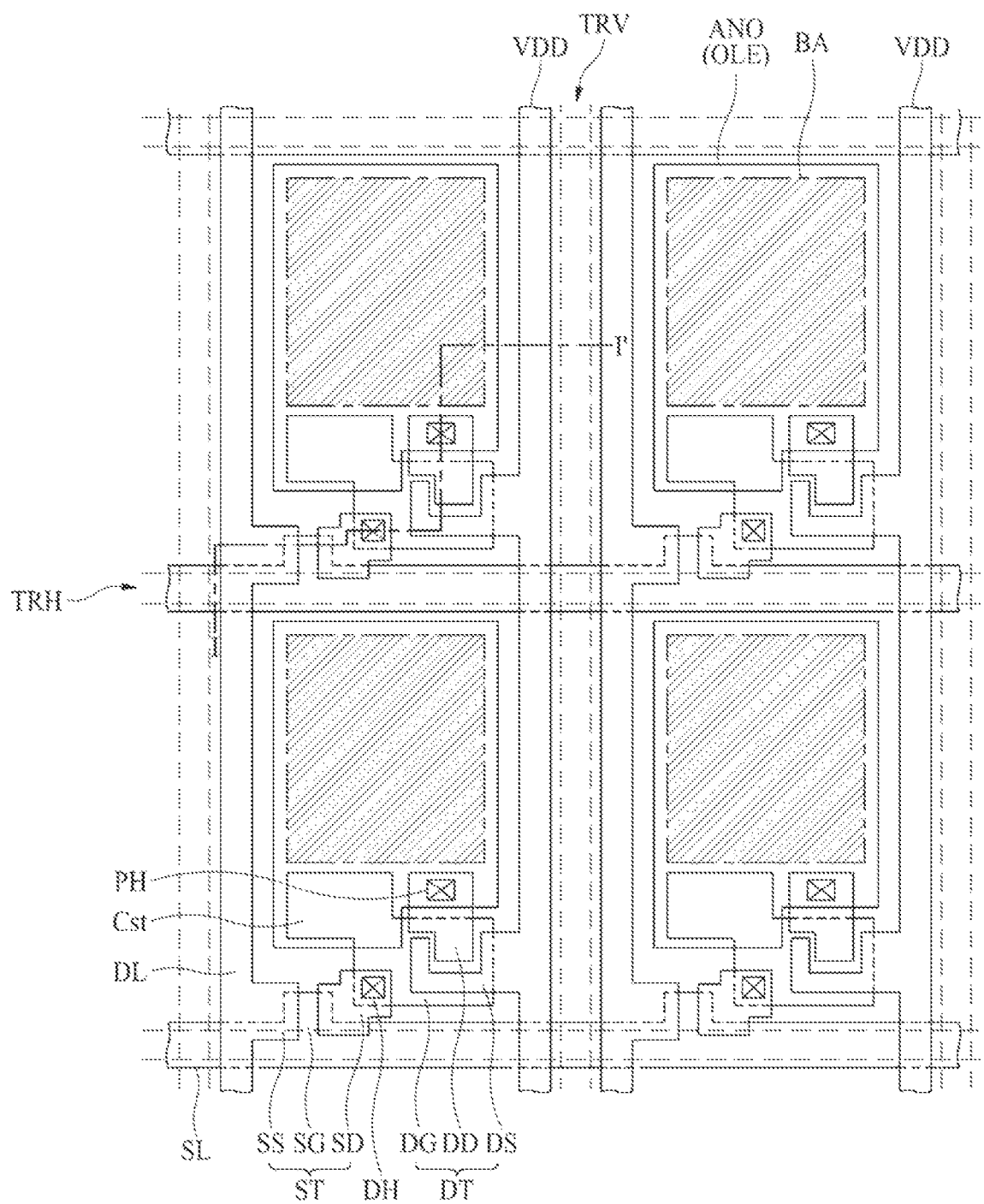
FIG. 3 is a plan view illustrating a structure of 2×2 pixels in the electroluminescence display according to a first embodiment of the present disclosure.
Figure 4:
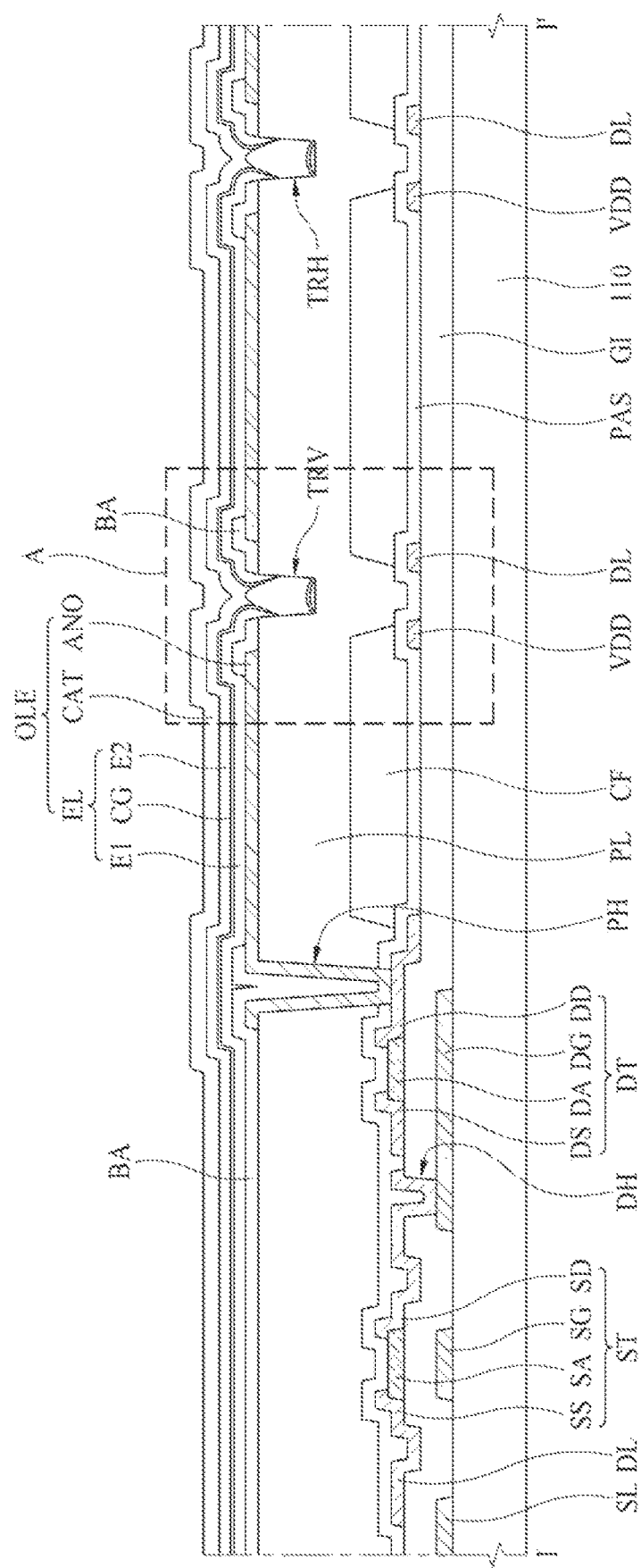
FIG. 4 is a cross-sectional view along to cutting line I-I' in FIG. 3, for illustrating the structure of the electroluminescence display according to the first embodiment of the present disclosure.

Hereinafter, referring to FIGS. 2 to 4, an electroluminescence display according to the first embodiment of the present disclosure will be explained. FIG. 2 is a circuit diagram illustrating a structure of one pixel according to the present disclosure. FIG. 3 is a plan view illustrating a structure of 2×2 pixels in the electroluminescence display according to the first embodiment of the present disclosure. FIG. 4 is a cross-sectional view along to cutting line I-I' in FIG. 3, for illustrating the structure of the electroluminescence display according to the first embodiment of the present disclosure.

Referring to FIGS. 2 to 4, one-pixel P of the light emitting display can be defined by a scan line SL, a data line DL and a driving current line VDD. One pixel of the light emitting display can include a switching thin film transistor ST, a driving thin film transistor DT, a light emitting diode OLE and a storage capacitance (or storage capacitor) Cst. The driving current line VDD can be supplied with a high-level voltage for driving the light emitting diode OLE.

For example, the switching thin film transistor ST can be disposed at the portion where the scan line SL and the data line DL is crossing. The switching thin film transistor ST can include a switching gate electrode SG, a switching source electrode SS and a switching drain electrode SD. The switching gate electrode SG can be connected to the scan line SL. The switching source electrode SS can be connected to the data line DL and the switching drain electrode SD can be connected to the driving thin film transistor DT. By supplying the data signal to the driving thin film transistor DT, the switching thin film transistor ST can play a role of selecting a pixel which would be driven.

The driving thin film transistor DT can play a role of driving the light diode OLE of the selected pixel by the switching thin film transistor ST. The driving thin film transistor DT can include a driving gate electrode DG, a driving source electrode DS and a driving drain electrode DD. The driving gate electrode DG can be connected to the switching drain electrode SD of the switching thin film transistor ST. For example, the switching drain electrode SD can be connected to the driving gate electrode DG via the drain contact hole DH penetrating the gate insulating layer GI. The driving source electrode DS can be connected to the driving current line VSS, and the driving drain electrode DD can be connected to an anode electrode ANO of the light emitting diode OLE. A storage capacitance Cst can be disposed between the driving gate electrode DG of the driving thin film transistor DT and the anode electrode ANO of the light emitting diode OLE.

The driving thin film transistor DT can be disposed between the driving current line VDD and the light emitting diode OLE. The driving thin film transistor DT can control the amount of electric currents flowing to the light emitting diode OLE from the driving current line VDD according to the voltage level of the driving gate electrode DG connected to the switching drain electrode SD of the switching thin film transistor ST.

The light emitting diode OLE can include an anode electrode ANO, an emission layer EL and a cathode electrode CAT. The light emitting diode OLE can emit the light according to the amount of the electric current controlled by the driving thin film transistor DT. In other word, the light emitting diode OLE can be driven by the voltage differences between the low-level voltage and the high-level voltage controlled by driving thin film transistor DT.

The passivation layer PAS can be deposited on the top surface of the substrate 110 having the thin film transistors ST and DT. By example, the passivation layer PAS is made of inorganic material such as silicon oxide (SiOx) or silicon nitride (SiNx). The color filter CF can be formed on the passivation layer PAS. By example, the color filter CF can be disposed as fully overlapping with the anode electrode ANO which can be formed later.

The planarization layer PL can be deposited on the passivation layer PAS and the color filter CF. The planarization layer PL can be the film layer for flattening the non-uniform surface of the substrate 110 on which the thin film transistors ST and DT are formed. In order to make the even surface condition of the substrate 110, the planarization layer PL can be formed of an organic material. The passivation layer PAS and the planarization layer PL can include the pixel contact hole PH exposing some portions of the driving drain electrode DD of the driving thin film transistor DT.

The anode electrode ANO can be formed on the planarization layer PL. The anode electrode ANO can be connected to the driving drain electrode DD of the driving thin film transistor DT through a pixel contact hole PH formed at the planarization layer PL. The anode electrode ANO can have various structures and different materials according to the emission type of the organic light emitting diode OLE. For an example, for the bottom emission type in which the light can be provided to the substrate 110 direction from the emission layer EL, the anode electrode ANO can be made of a transparent conductive material. For example, the anode electrode ANO of the bottom emission type can include an oxide conductive material such as indium-zinc-oxide (or IZO) or indium-tin-oxide (or ITO). For another example, for the top emission type in which the light can be provided to the upper direction opposite the substrate 110, the anode electrode ANO can be made of metal materials having excellent or predetermined light reflectance. FIG. 4 shows the structure of the bottom emission type, the present disclosure can be applicable to the top emission type.

A bank BA can be formed on the anode electrode ANO. The bank BA can cover the circumference areas of the anode electrode ANO and can expose most of middle areas of the anode electrode ANO. The middle areas of the anode electrode ANO exposed by the bank BA can be defined the emission area.

The trench TR can be disposed between the pixels formed by removing some portions of the bank BA and the planarization layer PL. The trench TR can include a horizontal trench TRH and a vertical trench TRV. The horizontal trench TRH can extend along the X-axis direction or transverse direction in a plane view on the substrate 110. The vertical trench TRV can extend along the Y-axis direction or longitudinal direction in a plane view on the substrate 110. One vertical trench TRV can be disposed at the left side and the right side of the pixel, and one horizontal trench TRH can be disposed at the upper side and the lower side of the pixel.

An emission layer EL can be deposited on the bank BA and the anode electrode ANO. The emission layer EL can be deposited over the whole surface of the display area DA on the substrate 110, as covering the anode electrodes ANO and banks BA. For an example, the emission layer EL can include two or more stacked emission portions for emitting white light. In detail, the emission layer EL can include a first emission layer providing first color light and a second emission layer providing second color light, for emitting the white light by combining the first color light and the second color light. In this instance, a charge generation layer CG can be disposed between the first emission layer E1 and the second emission layer E2. The first emission layer E1, which is disposed between the anode electrode ANO and the charge generation layer CG, can emit the first color light. The second emission layer E2, which is disposed between the charge generation layer CG and the cathode electrode CAT, can emit the second color light.

The cathode electrode CAT can be disposed on the emission layer EL. The cathode electrode CAT can be stacked on the emission layer EL as being in surface contact with the second emission layer E2. The cathode electrode CAT can be formed as one sheet element over the whole area of the substrate 110 as being commonly connected whole emission layers EL disposed at all pixels. In the instance of the bottom emission type, the cathode electrode CAT can include metal material having excellent light reflection ratio. For example, the cathode electrode CAT can include at least any one of silver (Ag), aluminum (Al), molybdenum (Mo), gold (Au), magnesium (Mg), calcium (Ca), or barium (Ba).

Figure 5:
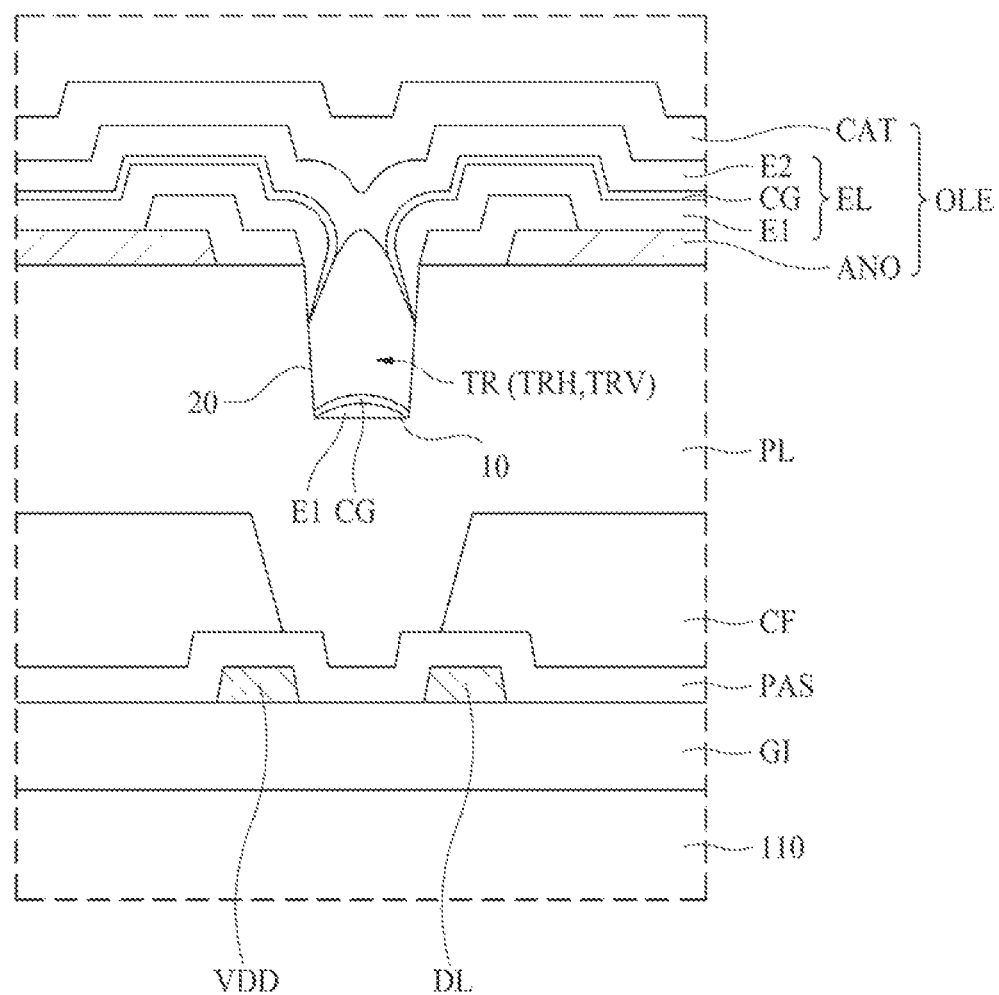
FIG. 5 is an enlarged cross-sectional view illustrating a structure of part 'A' indicated by a dotted rectangle in FIG. 4.

Hereinafter, referring to FIG. 5, the structure for cutting the electric connection between the pixels by the trench will be described. FIG. 5 is an enlarged cross-sectional view illustrating a structure of part 'A' indicated by a dotted rectangle in FIG. 4.

The gate insulating layer GI is deposited on the substrate 110. The driving current line VDD and the data line DL are formed on the gate insulating layer GI. The passivation layer PAS is deposited on the driving current line VDD and the data line DL. The color filter CF is deposited on the passivation layer PAS. For example, between any neighboring two pixels, a red color filter can be formed at the left pixel and a green color filter can be formed at the right pixel.

The planarization layer PL is deposited on the color filter CF. The anode electrode ANO is formed on the planarization layer PL. The bank BA is formed on the anode electrode ANO as covering circumference areas of the anode electrode ANO. Between two neighboring pixels, the trench TR is disposed. The trench TR can be formed by etching some portions of the bank BA and the planarization layer PL with a predetermined depth. The etched portions can be disposed between two neighboring anode electrodes ANO. FIG. 5 illustrates, for convenience, only the structure of the vertical trench TRV disposed between the driving current line VDD and the data line DL, the horizontal trench TRH can also have the same structure.

The trench TR can include a well structure having a bottom surface 10 and the side-wall surface 20. With the trench TR, the first emission layer E1 can be deposited on the anode electrode ANO and the bank BA. As the result, the first emission layer E1 can be deposited on the bottom surface 10 of the trench TR. However, on the side-wall surface 20, the first emission layer E1 need not be fully deposited, but it can be partially deposited at the top portions of the trench TR. For example, the first emission layer E1 can be deposited on the surface of the substrate 110, but the electrical connection of the first emission layer E1 can be cut, so that it can be separated in a pixel unit.

The charge generation layer CG can be deposited on the first emission layer E1. On the bottom surface 10 of the trench TR, the charge generation layer CG can be deposited on the first emission layer E1. On the side-wall surface 20, the charge generation layer CG can be partially deposited at the top portions. For example, the stacked shape of the charge generation layer CG can have a shape as covering some portions of the first emission layer E1. In some instances, the charge generation layer CG can cover the whole of the first emission layer E1. The charge generation layer CG can be deposited on the surface of the substrate 110, but the electrical connection of the charge generation layer CG can be cut, so that it can be separated in a pixel unit.

The second emission layer E2 is deposited on the charge generation layer CG. The top portions of the trench TR is in a state in which a width of the trench TR is narrowed due to the previously stacked profile of the first emission layer E1 and the charge generation layer CG. Under this condition, as the deposition process of the second emission layer E2 is performed, the second emission layer E2 becoming increasingly thicker from the left side and the second emission layer E2 becoming increasingly thicker from the right side can contact each other at the top portion of the trench TR. Thus, a cross sectional shape (or profile) of the top space of the trench TR can be filled or closed. As the result, the second emission layer E2 can have a structure in which the second emission layer E2 can be connected over all pixels on the whole surface of the substrate 110. Further, the second emission layer E2 need not be deposited within the trench TR. However, according to the depth or the height of the trench TR, some portions of the second emission layer E2 can be disconnected by the trench TR.

After that, the cathode electrode CAT is deposited on the second emission layer E2. Since the second emission layer E2 has a structure connected between all pixels on the entire surface of the substrate 110, the cathode electrode CAT also has a structure connected between all pixels. An encapsulation layer can be deposited on the cathode electrode CAT.

With the structure as shown in FIG. 5, the first emission layer E1 deposited just on the anode electrode ANO can include a hole transport layer. Since the first emission layer E1 is divided for each pixel by the trench TR, a problem in which charges move between neighboring pixels through the charge transport layer can be prevented or reduced. In addition, since the charge generation layer CG stacked on the first emission layer E1 is also divided in pixel units by the trench TR, the problem in which charges move between neighboring pixels through the charge generation layer CG can be prevented or reduced.

The second emission layer E2 can include an electron transport layer. By example, the electron transport layer can be a common layer connected over all pixels, like the cathode electrode CAT. Even though the electrons can move between neighboring pixels through the electron transport layer, the flow of the holes can be blocked between neighboring pixels due to the trench TR. Therefore, there is no problem of the display quality due to the lateral leakage current.

Figure 6:
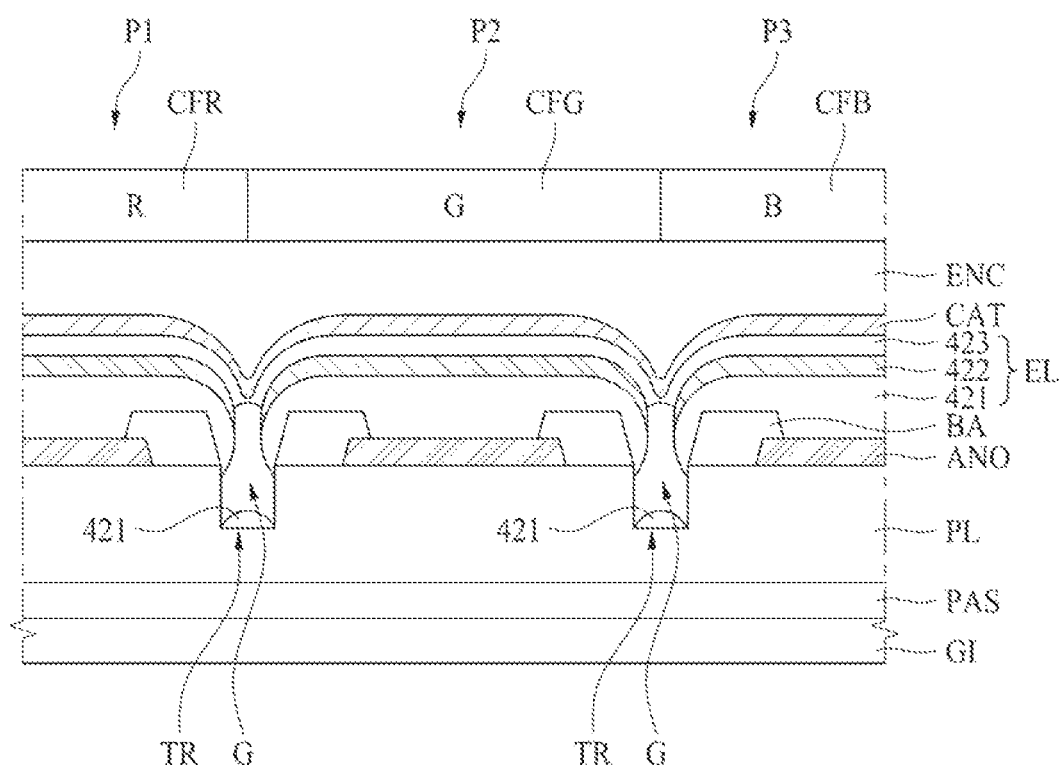
FIG. 6 is a cross-sectional view illustrating a structure of an electroluminescence display according to the first embodiment of the present disclosure.

With FIGS. 4 and 5, explained is the bottom emission type electroluminescence display having the structure for suppressing the lateral leakage current by the trench according to the first embodiment. The features of the present disclosure can be applied to the top emission type electroluminescence display as shown in FIG. 6. FIG. 6 is a cross-sectional view illustrating a structure of an electroluminescence display according to the first embodiment of the present disclosure.

Referring to FIG. 6, the electroluminescence display according to another example of the first embodiment can include a substrate, a circuit element layer, a planarization layer PL, a first electrode ANO, an emission layer EL, a second electrode CAT, a bank BA, an encapsulation layer ENC, a first color filter CFR, a second color filter CFG and a third color filter CFB. The substrate and circuit element layer can be the same with substrate 110 and thin film transistors ST and DT explained above, so the explanation for these elements may not be duplicated.

The electroluminescence display shown in FIG. 6 can have a top emission structure in which the light from the emission layer can be emitted to the upward direction opposite the substrate. Therefore, the substrate can be made of transparent material or an opaque material.

The planarization layer PL can be deposited on the circuit element layer. The planarization layer PL can be made of an organic material such as acryl resin, epoxy resin, phenolic resin, polyamide resin and polyimide resin. Otherwise, the planarization layer PL can be made of an inorganic material such as silicon nitride, aluminum nitride, zirconium nitride, titanium nitride, hafnium nitride, tantalum nitride, silicon oxide, aluminum oxide or titanium oxide.

The planarization layer PL can have the trench TR disposed at the border area between the first sub-pixel P1 and the second sub-pixel P2 and at the border area between the second sub-pixel P2 and the third sub-pixel P3. The trench TR can be disposed at an area between the bank BA covering the end of the first electrode ANO of the first sub-pixel P1 and the bank BA covering the end of the first electrode ANO of the second sub-pixel P2, and at an area between the bank BA covering the end of the first electrode ANO of the second sub-pixel P2 and the bank BA covering the end of the first electrode ANO of the third sub-pixel P3. The trench TR can be dug into a predetermined region inside the planarization layer PL without penetrating the planarization layer PL. However, it is not limited thereto. The trench TR can pass through the planarization layer PL and can extend into a predetermined region inside the circuit element layer below the planarization layer PL in other embodiments.

The bank BA can be formed at the boundary area between the adjacent sub-pixels P1 to P3 in a matrix structure. One end of the bank BA can be disposed to be in contact with the entrance (or upper aperture) of the trench TR, or can be spaced apart from the entrance of the trench TR by a predetermined distance. The bank BA can be formed as covering both end portions of the first anode electrode disposed at the first to third sub-pixels P1 to P3. Therefore, the exposed portion of the first electrode ANO not covered by the bank BA can be defined as the emission area.

The emission layer EL can be formed on the bank BA and the first electrode ANO. For example, the emission layer EL can be formed as covering the boundary areas of the adjacent sub-pixels P1 to P3. The emission layer EL can be configured to emit white light. In this instance, the emission layer EL can include a plurality of stacks that emit light of different colors. For example, the emission layer EL can include a first stack 421, a second stack 423 and a charge generation layer (or CGL) 422 provided between the first stack 421 and the second stack 423.

For example, the first stack 421 can include a hole injection layer, a first hole transport layer, a first organic emission layer and a first electron transport layer sequentially stacked. The second stack 423 can include a second hole transport layer, a second organic emission layer, a second electron transport layer and an electron injection layer sequentially stacked. The charge generation layer 422 can include a N-type charge generation layer supplying electrons to the first stack 421 and a P-type charge generation layer supplying holes to the second stack 423.

The emission layer EL can be formed inside the trench TR and on the trench TR. When the emission layer EL is disposed inside the trench TR, the emission layer EL or portions can be disconnected between the neighboring two sub-pixels, so the leakage current between the adjacent sub-pixels P1 to P3 can be prevented or reduced. At the disconnection of the emission layer EL, the portions of the emission layer EL that are disconnected can have tapered ends with reduced thicknesses.

In detail, the first stack 421 can be disposed on an inside wall and a bottom surface of the trench TR. Here, the first stack 421 can be disconnected without being continuous over the trench TR. Therefore, the electric carriers need not flow through the first stack 421 between the first sub-pixel P1 and the second sub-pixel P2 and between the second sub-pixel P2 and the third sub-pixel P3 which are adjacent each other with the trench TR interposed there-between.

The charge generation layer 422 can be deposited on the first stack 421. Here, the charge generation layer 422 can be disconnected at the inside of the trench TR or a region overlapping the trench TR. Therefore, the electric carriers need not flow through the charge generation layer 422 between the first sub-pixel P1 and the second sub-pixel P2 and between the second sub-pixel P2 and the third sub-pixel P3 which are adjacent each other with the trench TR interposed there-between. At the disconnection of the charge generation layer 422, the portions of the charge generation layer 422 can have a tapered end with reduced thicknesses.

The second stack 423 can be deposited on the charge generation layer 422. Here, the second stack 423 can be continuously disposed between the first sub-pixel P1 and the second sub-pixel P2 and between the second sub-pixel P2 and the third sub-pixel P3 which are adjacent each other with the trench TR interposed there-between. In some instances, the second stack 423 can be disconnected at some portions by the trench TR but can be connected at other portions over the trench TR. Therefore, the electric carriers can flow through the second stack 423 between the first sub-pixel P1 and the second sub-pixel P2 and between the second sub-pixel P2 and the third sub-pixel P3 which are adjacent each other with the trench TR interposed there-between.

Due to the above-mentioned structures of the first stack 421, the charge generation layer 422 and the second stack 423, an empty gap (or void) G can be provided in the emission layer EL. In detail, the void G can be formed inside the trench TR and can extend over the trench TR. Here, the upper end of the void G can be located at the higher position than the charge generating layer 422, so that the charge generation layer 422 can be disconnected by the void G at the trench TR. In addition, the width of the void G can be gradually narrowed from the bottom of the void G to the top of the void G.

The second electrode CAT can be formed on the second stack 423. The second electrode CAT can be the cathode electrode of the display. The second electrode CAT can be deposited over the sub-pixels P1 to P3 and the boundary areas between the sub-pixels P1 to P3. Since the upper surface of the second stack 423 is not disconnected, the second electrode CAT can be deposited on the emission layer EL in stable, the profile of the second electrode CAT can have concaved shape at the area overlapping the trench TR.

Since the display shown in FIG. 6 can have the top emission type, the second electrode CAT can be made of a transparent conductive material such as indium-tin-oxide (ITO) or indium-zinc-oxide (IZO) in order to transmit the light emitted from the emission layer EL toward the upper direction. In addition, the second electrode CAT can be formed as having a single-layer structure or multiple-layer structure.

The encapsulation layer ENC can be disposed on the second electrode CAT. The encapsulation layer ENC can be made of an inorganic material, an organic material or a mixture of an inorganic material and an organic material, and can be configured as a single layer or a multi-layer. The color filters can be disposed on the encapsulation layer ENC. The color filters can include a first color filter CFR representing red color R allocated at the first sub-pixel P1, a second color filter CFG representing green color G allocated at the second sub-pixel P2, and a third color filter CFB representing blue color B allocated at the third sub-pixel P3. For the first sub-pixel P1, only the red color R can be transmitted as the white color light passes through the first color filter CFR. For the second sub-pixel P2, only the green color G can be transmitted as the white color light passes through the second color filter CFG. For the third sub-pixel P3, only the blue color B can be transmitted as the white color light passes through the third color filter CFB.

Accordingly, in the first embodiment, by disconnecting the charge generation layer 422 at the boundary areas between the sub-pixels P1 to P3 using the trench TR disposed under the emission layer EL, the lateral leakage current flowing between the boundary areas of adjacent sub-pixels P1 to P3 can be blocked. In detail, the charge generation layer 422 can have higher conductivity than the first stack 421 and the second stack 423. Specifically, since the N-type charge generation layer of the charge generation layer 422 can include metal material, it has higher conductivity than the first stack 421 and the second stack 423. The electrical carriers can mainly flow through the charge generation layer 422 between the sub-pixels P1 to P3, so the amounts of electrical carriers through the second stack 423 can be very low. Therefore, by forming the charge generation layer 422 to be disconnected at the inside of the trench TR, it is possible to reduce the movement of the electrical carriers between the sub-pixels P1 to P3 disposed adjacent to each other, so that the occurrence of the lateral leakage current can be prevented or reduced.

Second Embodiment

In the above first embodiment, an electroluminescence display having a structure for preventing or reducing the lateral leakage current by forming a trench TR surrounding each pixel has been described. As the density of the pixels increases, the size of the pixels dependently decreases, and the distance between the pixels decreases. In the instance of the pixel density is not high, for example, 1K PPI (Pixel Per Inch) or less, the lateral leakage current between neighboring pixels along the X-axis direction that is turned on at the same time according to the scan signal can be the main cause of image quality degradation. Accordingly, only with the vertical trench TRV extending along the Y-axis direction between the pixels can sufficiently prevent or reduce deterioration of image quality due to the lateral leakage current. However, when the pixel density is increased, for example, 1K to 2K PPI, the lateral leakage current between pixels adjacent along the Y-axis direction can cause the image quality degradation. As a result, it is necessary to have a structure in which a horizontal trench TRH extending along the X-axis direction is further added, so that image quality deterioration due to the lateral leakage current can be completely prevented, as explained in the first embodiment.

Furthermore, when the pixel density is much higher, for example, in the instance of ultra-high resolution of 4K PPI or higher, the distance between pixels becomes very narrow, and the width of the trench must be narrowed also. Under this condition, a problem occurs in that the width of the trench is widened at a portion where the horizontal trench TRH and the vertical trench TRV intersect.

When the width of the trench TR is widened where the horizontal trench TRH and the vertical trench TRV intersect, the charge generation layer CF can be contacted with the cathode electrode CAT, so that the light emitting diode can be defective. Therefore, by example, the width of the trench TR is determined in consideration of the thickness of the first emission layer E1, the charge generation layer CG and the second emission layer E2 stacked on the anode electrode ANO, so that the first emission layer E1 and the charge generation layer CG are disconnected by the trench TR.

Figure 7:
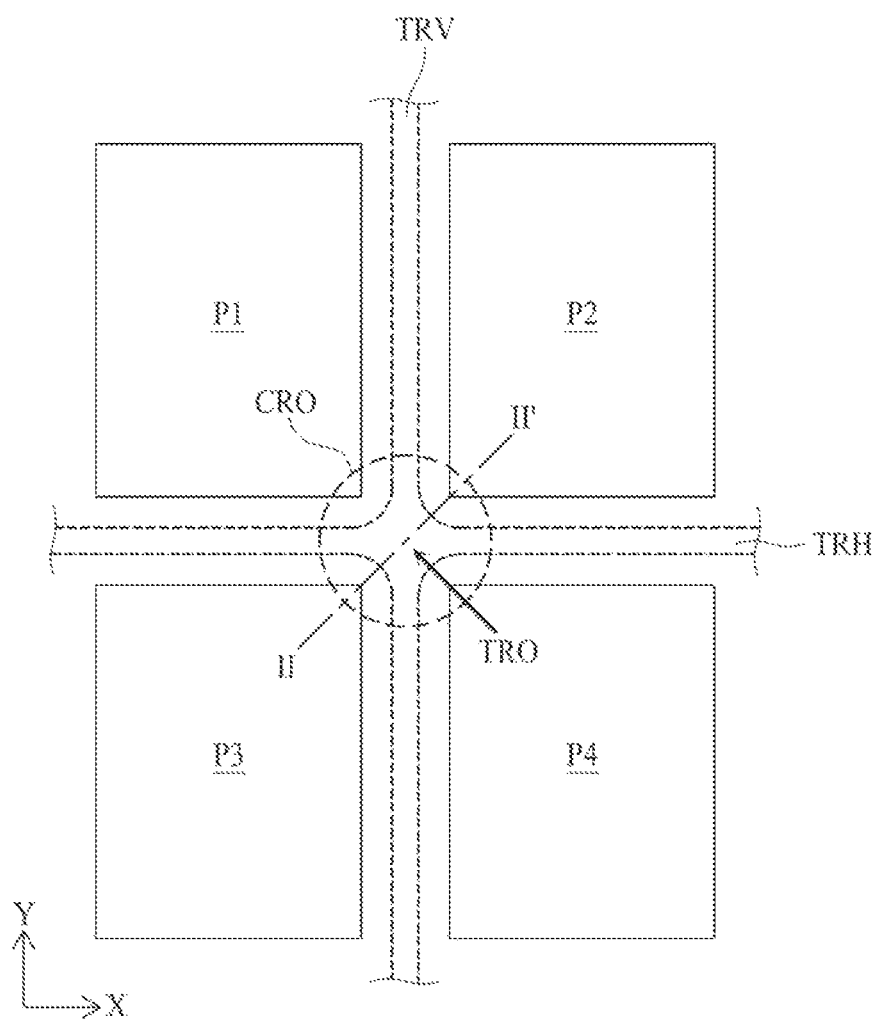
FIG. 7 is a plane view illustrating a structure of trench disposed between 2×2 pixels in an electroluminescence display according to the first embodiment of the present disclosure.
Figure 8:
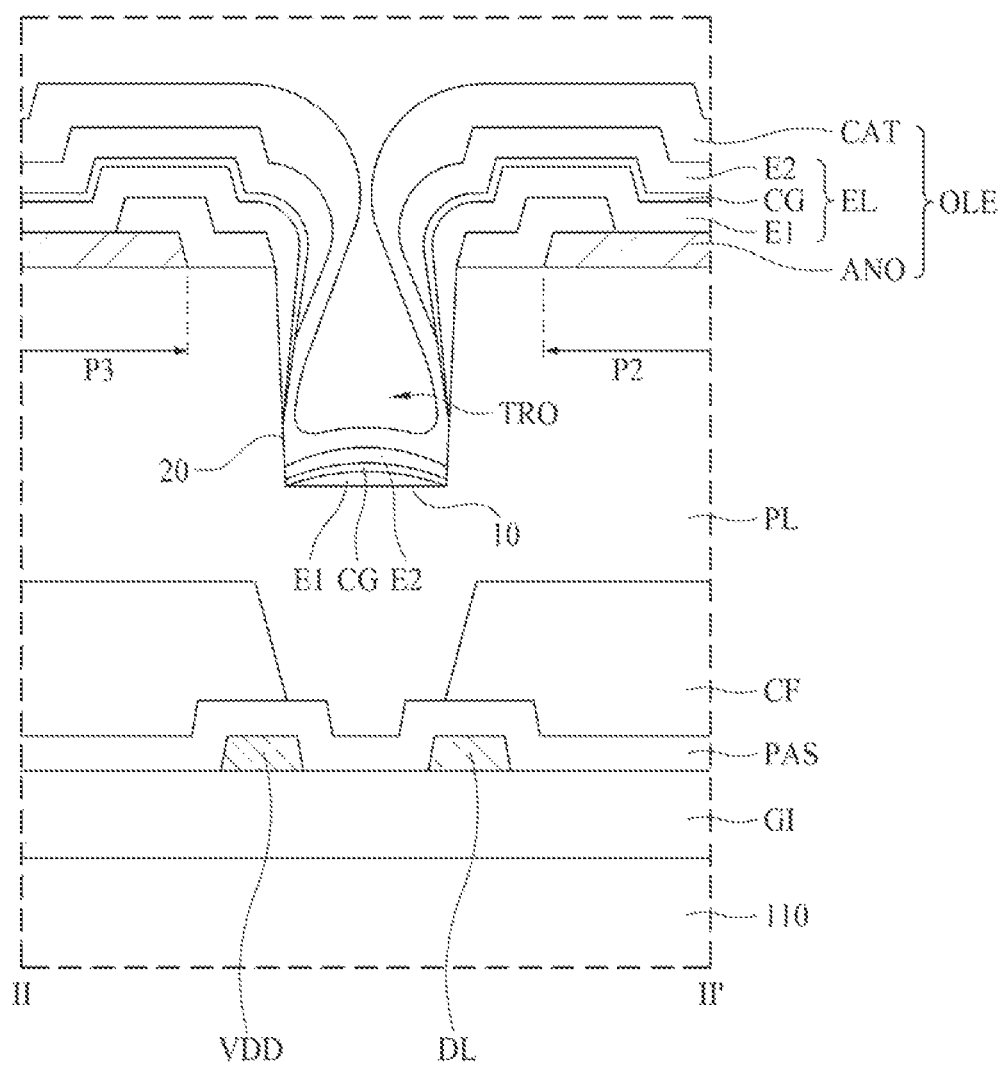
FIG. 8 is a cross-sectional view along to cutting line II-II' in FIG. 7, for illustrating a structure of an electroluminescence display according to the first embodiment of the present disclosure.

This will be explained in detail with reference to FIGS. 7 and 8. FIG. 7 is a plane view illustrating a structure of trench disposed between 2×2 pixels in an electroluminescence display according to the first embodiment of the present disclosure. FIG. 8 is a cross-sectional view along to cutting line II-II' in FIG. 7, for illustrating a structure of an electroluminescence display according to the first embodiment of the present disclosure.

As shown in FIG. 7, a description will be made based on a 2×2 matrix structure. The first pixel P1 can be arranged in $1^{st}$ row and $1^{st}$ column, the second pixel P2 can be arranged in $1^{st}$ row and $2^{nd}$ column, the third pixel P3 can be arranged in $2^{nd}$ row and $1^{st}$ column, and the fourth pixel P4 can be arranged in $2^{nd}$ row and $2^{nd}$ column. The vertical trench TRV can be disposed between the first pixel P1 and the second pixel P2 and between the third pixel P3 and the fourth pixel P4. The horizontal trench TRH can be disposed between the first pixel P1 and the third pixel P3 and between the second pixel P2 and the fourth pixel P4.

The vertical trench TRV and the horizontal trench TRH can have a predetermined width. In this instance, the etchant can be concentrated at the intersection portion CRO where the vertical trench TRV and the horizontal trench TRH are crossing, so that the corner portions are over etched and a cross-trench TRO can be formed with wider width than the vertical trench TRV and the horizontal trench TRH.

With the condition in which the cross-trench TRO having a width wider than those of the vertical trench TRV and the horizontal trench TRH, the first emission layer E1 can be deposited on the anode electrode ANO and the bank BA. As the result, even though the first emission layer E1 can be stacked on the bottom surface 10 of the cross-trench TRO, it can be not stacked on the side wall surface 20 and is stacked on the top surface. The first emission layer E1 can be deposited on the whole surface of the substrate 110, but the portions of the first emission layer E1 can be disconnected by the cross-trench TRO, so that the first emission layer E1 can be separated in the pixels.

The charge generation layer CG can be deposited on the first emission layer E1. On the bottom surface 10 of the cross-trench TRO, the charge generation layer CG can be stacked on the first emission layer E1. On the side wall surface 20, the charge generation layer CG can cover the first emission layer E1 and can extend to the bottom of the side wall surface 20. This can be caused by the width of the cross-trench TRO being wider than those of the other trenches TRV and TRH. The charge generation layer CG can be deposited on the whole surface of the substrate 110, but the portions of the charge generation layer CG can be disconnected by the cross-trench TRO, so that the charge generation layer CG can be separated in the pixels.

The second emission layer E2 can be deposited on the charge generation layer CG. On the bottom surface 10 of the cross-trench TRO, the second emission layer E2 can be stacked on the charge generation layer CG. As the deposition process of the second emission layer E2 is performed, the second emission layer E2 becoming increasingly thicker from the left pixel and the second emission layer E2 becoming increasingly thicker from the right pixel can cover the charge generation layer CG at the upper portion of the trench TR. However, the upper portion of the cross-trench TRO need not be closed and can be formed in an open structure.

After that the cathode electrode CAT can be deposited on the second emission layer E2. Since the cross-trench TRO is not closed or covered by the second emission layer E2, the cathode electrode CAT can be deposited along the open shaped profile of the cross-trench TRO so as to be deposited on the side wall surface 20 and the bottom surface 10. For example, the cathode electrode CAT can have a deposited profile connecting all pixels via the side-wall surface 20 and the bottom surface 10 of the cross-trench TRO.

Under this structure, the cathode electrode CAT can directly contact the exposed charge generation layer CG on the side wall 20 of the cross-trench TRO. When the cathode electrode CAT and the charge generation layer CG are directly connected in this way, the normal structure of the light emitting diode EL formed by the stacked structure of the anode electrode ANO, the organic emission layer EL and the cathode electrode CAT is not formed. Therefore, the light emitting diode EL can be defective.

Figure 9:
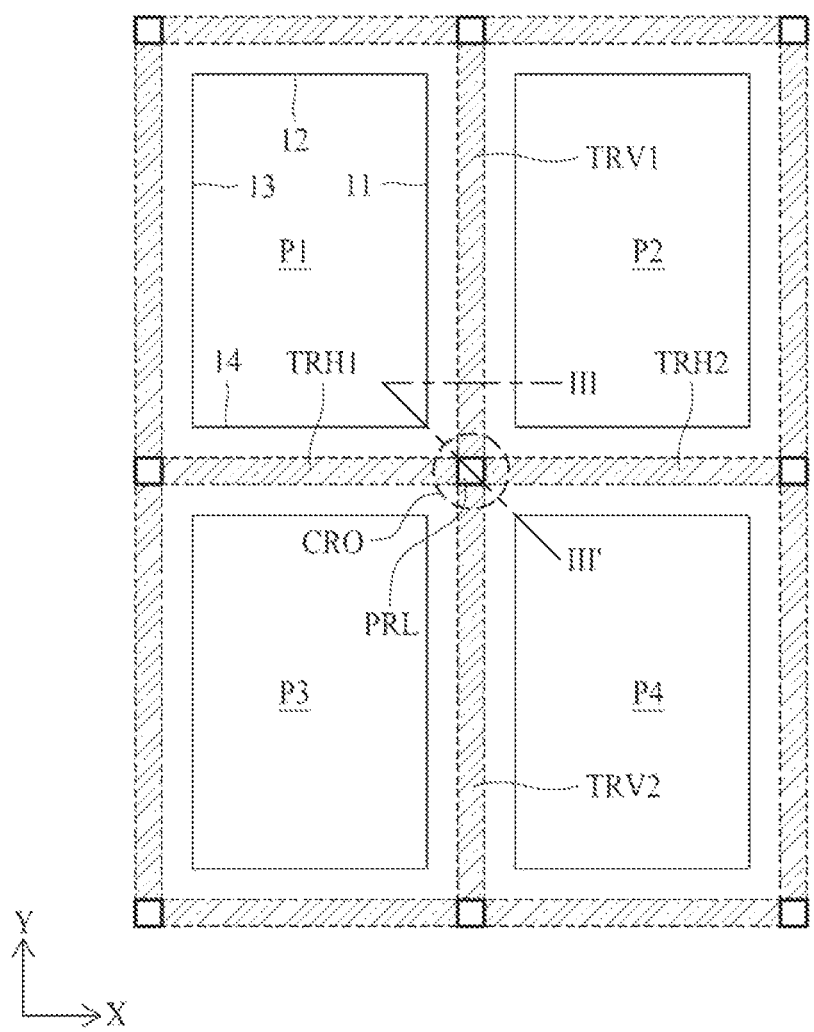
FIG. 9 is a plane view illustrating a structure of 2×2 pixels in the electroluminescence display according to a second embodiment of the present disclosure.
Figure 10:
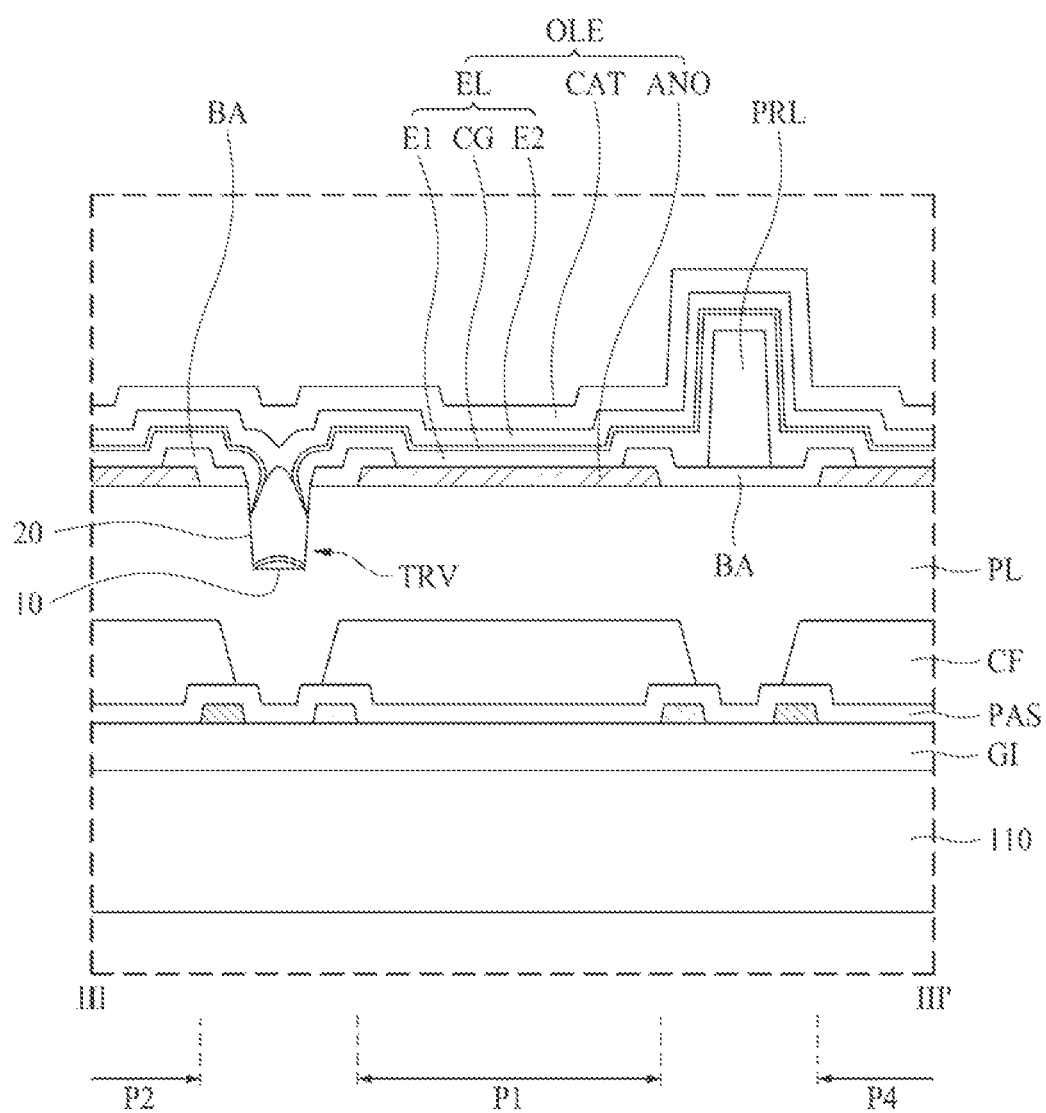
FIG. 10 is a cross-sectional view along to cutting line III-III' in FIG. 9, for illustrating a structure of an electroluminescence display according to the second embodiment of the present disclosure.

Hereinafter, referring to FIGS. 9 and 10, the second embodiment which is provided in order to prevent or reduce such a problem, will be described. FIG. 9 is a plane view illustrating a structure of 2×2 pixels in the electroluminescence display according to the second embodiment of the present disclosure. FIG. 10 is a cross-sectional view along to cutting line III-III' in FIG. 9, for illustrating a structure of an electroluminescence display according to the second embodiment of the present disclosure.

As shown in FIG. 9, shown are pixels arranged in a 2×2 matrix structure as an example. The first pixel P1 can be arranged in $1^{st}$ row and $1^{st}$ column, the second pixel P2 can be arranged in $1^{st}$ row and $2^{nd}$ column, the third pixel P3 can be arranged in $2^{nd}$ row and $1^{st}$ column, and the fourth pixel P4 can be arranged in $2^{nd}$ row and $2^{nd}$ column. Each pixel can have rectangular shape including a first side 11, a second side 12 perpendicular to the first side 11, a third side 13 parallel to the first side 11 and a fourth side 14 parallel to the second side 12. In embodiments of the present disclosure, a shape of each pixel need not be rectangular, and shapes including circular, oval or polygonal can be provided.

The trenches TR are disposed outside a plurality of sides, such as the four sides 11, 12, 13 and 14 of each pixel. The trench TR can include a vertical trench TRV disposed between pixels adjacent along the X-axis direction and a horizontal trench TRH disposed between pixels adjacent along the Y-axis direction. The vertical trenches TRV can be not connected as one body, but can have a separated line segment shape in each pixel. The horizontal trenches TRH can have the same shape and structure.

For example, a first vertical trench TRV1 can be disposed between the first pixel P1 and the second pixel P2, and a second vertical trench TRV2 can be disposed between the third pixel P3 and the fourth pixel P4. Further, a first horizontal trench TRH1 can be disposed between the first pixel P1 and the third pixel P3, and a second horizontal trench TRH2 can be disposed between the second pixel P2 and the fourth pixel P4.

The first vertical trench TRV1 and the second vertical trench TRV2 can have a same predetermined width, and the lengths can be the same with or little longer than the corresponding vertical sides of the pixel. The first horizontal trench TRH1 and the second horizontal trench TRH2 can have a same predetermined width, and the lengths can be the same with or little longer than the corresponding horizontal sides of the pixel.

At the intersection portion where the first vertical trench TRV1, the second vertical trench TRV2, the first horizontal trench TRH1 and the second horizontal trench TRH2 meet each other, a protrusion pillar PRL can be disposed. The protrusion pillar PRL can have a rectangular pillar shape in which a cross section has a quadrangular shape having four sides corresponding to the width of the trenches TR including the vertical trenches TRV and the horizontal trenches TRH. The protrusion pillar PRL can be made of an organic insulating material or an inorganic insulating material. In embodiments of the present disclosure, a shape of the protrusion pillar PRL need not be rectangular or cross shaped, but shapes including circular, oval or polygonal can be provided.

Referring to FIG. 10, the emission layer EL can have the stacked structure at the trench as explained in the first embodiment. For example, after forming the trench TR, the first emission layer E1 can be deposited on the anode electrode ANO and the bank BA. On the bottom surface 10 of the trench TR, the first emission layer E1 can be deposited. On the side wall surface 20 of the trench TR, the first emission layer E1 need not cover all of the side wall surface 20 but can be stacked on top portions only. Therefore, the first emission layer E1 can be deposited on the whole surface of the substrate 110, but the portions of the first emission layer E1 can be disconnected by trench TR in pixel unit.

The charge generation layer CG can be deposited on the first emission layer E1. The charge generation layer CG can be stacked on the bottom surface 10 of the trench TR. On the side wall surface 20, the charge generation layer CG can be deposited only at the top portions. Accordingly, the charge generation layer CG can be deposited on the whole surface of the substrate 110, but the portions of the charge generation layer CG can be disconnected by trench TR in pixel unit.

The second emission layer E2 can be deposited on the charge generation layer CG. The second emission layer E2 thickened from the left side and the second emission layer E2 thickened from the right side can contact each other at the top portion of the trench TR, so that the upper space of the trench TR can be closed. As the result, the second emission layer E2 can have a structure in which the second emission layer E2 or portions can be connected over all pixels on the whole surface of the substrate 110.

The cathode electrode CAT can be deposited on the second emission layer E2. Since the second emission layer E2 has a structure connected between all pixels on the entire surface of the substrate 110, the cathode electrode CAT also has a structure connected between all pixels.

On the other hand, the trench TR is not formed at the intersection portion CRO where the vertical trench TRV and the horizontal trench TRH intersect, but the protrusion pillar PRL stacked on the bank BA can be formed.

At the intersection portion CRO, the first emission layer E1 has a structure connected between the first pixel P1 and the fourth pixel P4 which are diagonally adjacent to each other as riding over the protrusion pillar PRL. However, due to the height of the protrusion pillar PRL, the first emission layer E1 can be deposited with a thickness on the side wall of the protrusion pillar PRL that is thinner than a thickness of the first emission layer E1 on the bank BA or the anode electrode ANO.

The charge generation layer CG can be deposited on the first emission layer E1. The charge generation layer CG can have a structure connected between the first pixel P1 and the fourth pixel P4 which are diagonally adjacent to each other as riding over the protrusion pillar PRL. However, due to the height of the protrusion pillar PRL, the charge generation layer CG can be deposited with a thin thickness on the side wall of the protrusion pillar PRL.

The second emission layer E2 can be deposited on the charge generation layer CG. The second emission layer E2 can have a structure connected between the first pixel P1 and the fourth pixel P4 which are diagonally adjacent to each other as riding over the protrusion pillar PRL. However, due to the height of the protrusion pillar PRL, the second emission layer E2 can be deposited with a thickness on the side wall of the protrusion pillar PRL that is thinner than a thickness of the second emission layer E2 on the anode electrode ANO.

The cathode electrode CAT can be deposited on the second emission layer E2. The cathode electrode CAT can have a structure connected between the first pixel P1 and the fourth pixel P4 which are diagonally adjacent to each other as riding over the protrusion pillar PRL. As the cathode electrode CAT can be made of inorganic material, the cathode electrode CAT can have a thickness the same with other portions on the side wall surface of the protrusion pillar PRL unlike the first emission layer E1, the charge generation layer CG and the second emission layer E2 which are organic materials.

Like this, at the protrusion pillar PRL, both the emission layer EL and the cathode electrode CAT can have a structure continuously connected without being disconnected. However, for the charge generation layer CG, the electrical resistance at the portion connected between the first pixel P1 and the fourth pixel P4 can have a very high value due to the height of the protrusion pillar PRL. In particular, the charge generation layer CG is significantly thinner than the first emission layer E1 and the second emission layer E2, and is stacked much thinner on the side wall surface of the protrusion pillar PRL than at the bank BA, for example, furthermore, the area occupied by the protrusion pillar PRL is very small compared to the pixel area. Therefore, a portion of the charge generation layer CG that passes over the protrusion pillar PRL can have a very high resistance. As the result, even though the charge generation layer CG can be physically connected between the first pixel P1 and the fourth pixel P4, the electrical connectivity can be the disconnected state.

Unlike the instance of the cross-trench TRO at the intersection portion CRO, the charge generation layer CG may not have a short circuit with the cathode electrode CAT, so that light emitting diode EL can be formed normally always.

The bank BA can be formed with a double stacked structure. The bank BA can define the emission area of the anode electrode ANO. In addition, in this disclosure, the bank BA can be used as an element for forming the trench TR. Therefore, according to the manufacturing process, the bank BA can be formed as a double layered structure. In this instance, the bank BA can include a first bank BA1 and the second bank BA2 that are sequentially stacked. The first bank BA1 and the second bank BA2 can be made of other materials having different characteristics.

Third Embodiment

Figure 11:
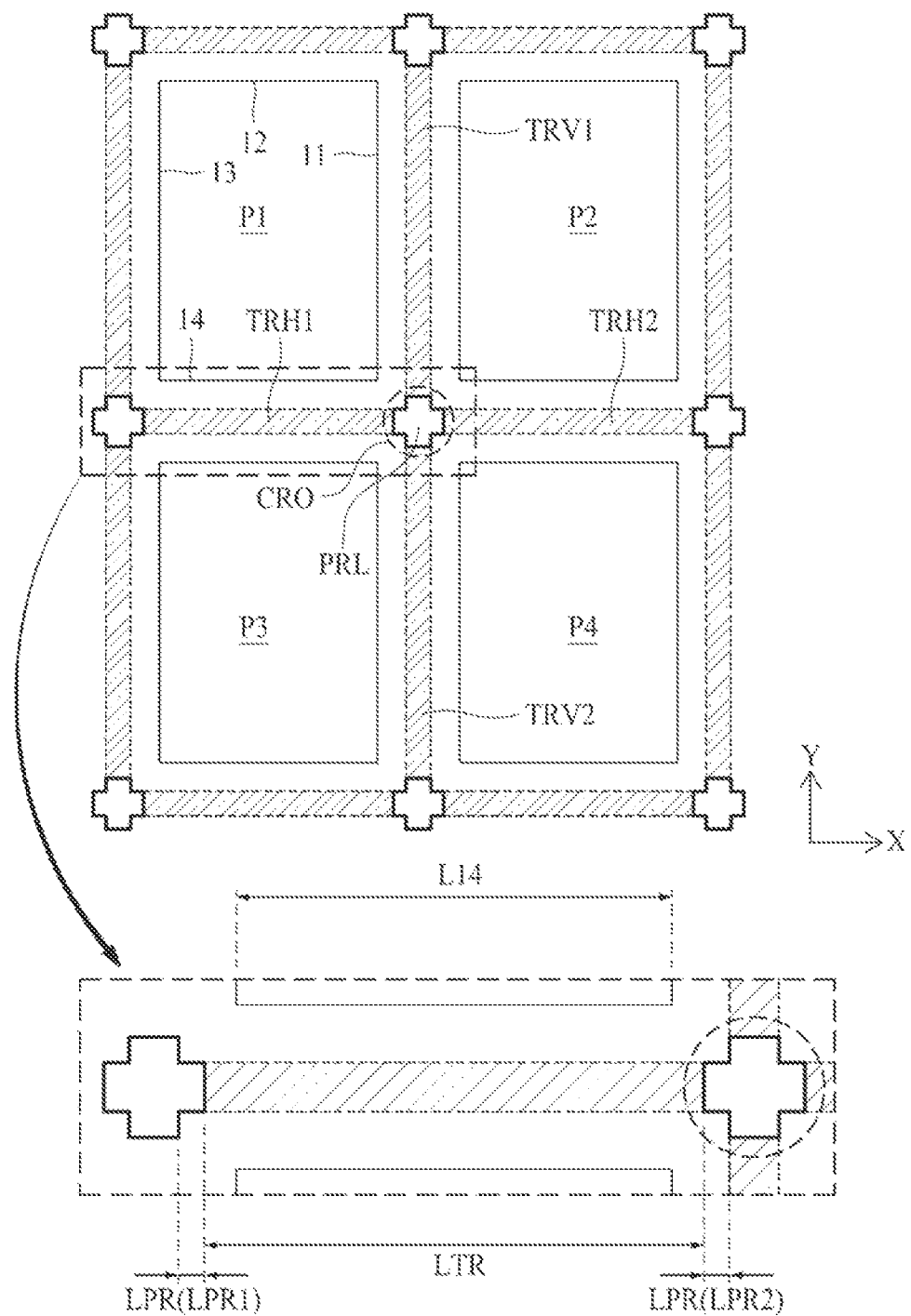
FIG. 11 is a plane view illustrating a structure of 2×2 pixels in the electroluminescence display according to a third embodiment of the present disclosure.

Hereinafter, referring to FIG. 11, the third embodiment will be described. FIG. 11 is a plane view illustrating a structure of 2×2 pixels in the electroluminescence display according to the third embodiment of the present disclosure.

FIG. 11 can show the same structure with the FIG. 9 explaining the second embodiment. The different point is the shape of the protrusion pillar PRL. Therefore, the same explanation may not be duplicated if not required. The feature of the third embodiment is that the protrusion pillars PRL are formed at respective ends of the first vertical trench TRV1, the second vertical trench TRV2, the first horizontal trench TRH1 and the second horizontal trench TRH2, respectively. Further, having a structure protruding in the trench directions (i.e., in a lateral direction), the rectangular pillar is changed into a '+' shaped (or a cross shaped) pillar in a cross-sectional view.

For example, the lateral length of the protrusion pillar PRL protruding toward the first horizontal trench TRH1 from the portion facing the first horizontal trench TRH1 can be as small as possible. Similarly, in a portion where the protrusion pillar PRL faces each of the second horizontal trench TRH2, the first vertical trench TRV1 and the second vertical trench TRV2, the lengths protruding toward each of the second horizontal trench TRH2, the first vertical trench TRV1 and the second vertical trench TRV2 can be as small as possible, for example.

As explained in the second embodiment, the protrusion pillar PRL can be a structure that maintains the connectivity of the emission layer EL between neighboring pixels without breaking the connectivity of the emission layer EL. However, the protrusion pillar PRL can give the same effect as the electrical disconnection by increasing the resistance in the structure that passes over the protruding pillar PRL. However, this can have a problem in which the resistance decreases as the area to be connected increases. Therefore, when the area of the protrusion pillar PRL can be more increased, an electrical disconnection effect may not be obtained.

Therefore, in the instance that the protrusion pillar PRL can be a '+' shaped pillar, the length protruding in the lateral direction can satisfy a condition that the emission layer EL overriding the protrusion pillar PRL can maintain high resistance. By example, as in the second embodiment, the protrusion pillar PRL can have a rectangular pillar shape without a length protruding in the lateral direction for improved performance and/or ease of manufacture.

The description will be based on the first horizontal trench TRH1 disposed on the fourth side 14 of the first pixel P1. The fourth side 14 can have a horizontal length L14 of the pixel. A length of the first horizontal trench TRH1 can be defined as the trench length LTR. In addition, a length protruding from the protrusion pillar PRL toward the first horizontal trench TRH1 can be defined as the protrusion length LPR. The trench length LTR can have a length equal to or longer than the horizontal length L14 of the pixel. FIG. 11 illustrates an instance in which the trench length LTR is longer than the horizontal length L14 of the pixel.

By example, the protrusion length LPR can be 10% or less of the trench length LTR. Even with a length longer than this, the maximum protrusion length LPR preferably does not exceed the separation distance between the trench and the pixel. When the protrusion length LPR is exceeded this maximum value, the resistance of the emission layer, particularly the charge generation layer CG, which passes over the protrusion pillar PRL can be lowered, thereby the lateral leakage current can be occurred so causing the distortion in image quality.

By Example, the ratio of (the first protrusion length LPR1 protruding from the protrusion pillar PRL disposed at one end of the first horizontal trench TRH1 toward the first horizontal trench TRH1):(the length of the first horizontal trench TRH1):(the second protrusion length LPR2 protruding from the protrusion pillar PRL disposed at the other end of the first horizontal trench TRH1 toward the first horizontal trench TRH1) can have any one of 1:8:1 to 0:10:0.

Fourth Embodiment

Figure 12:
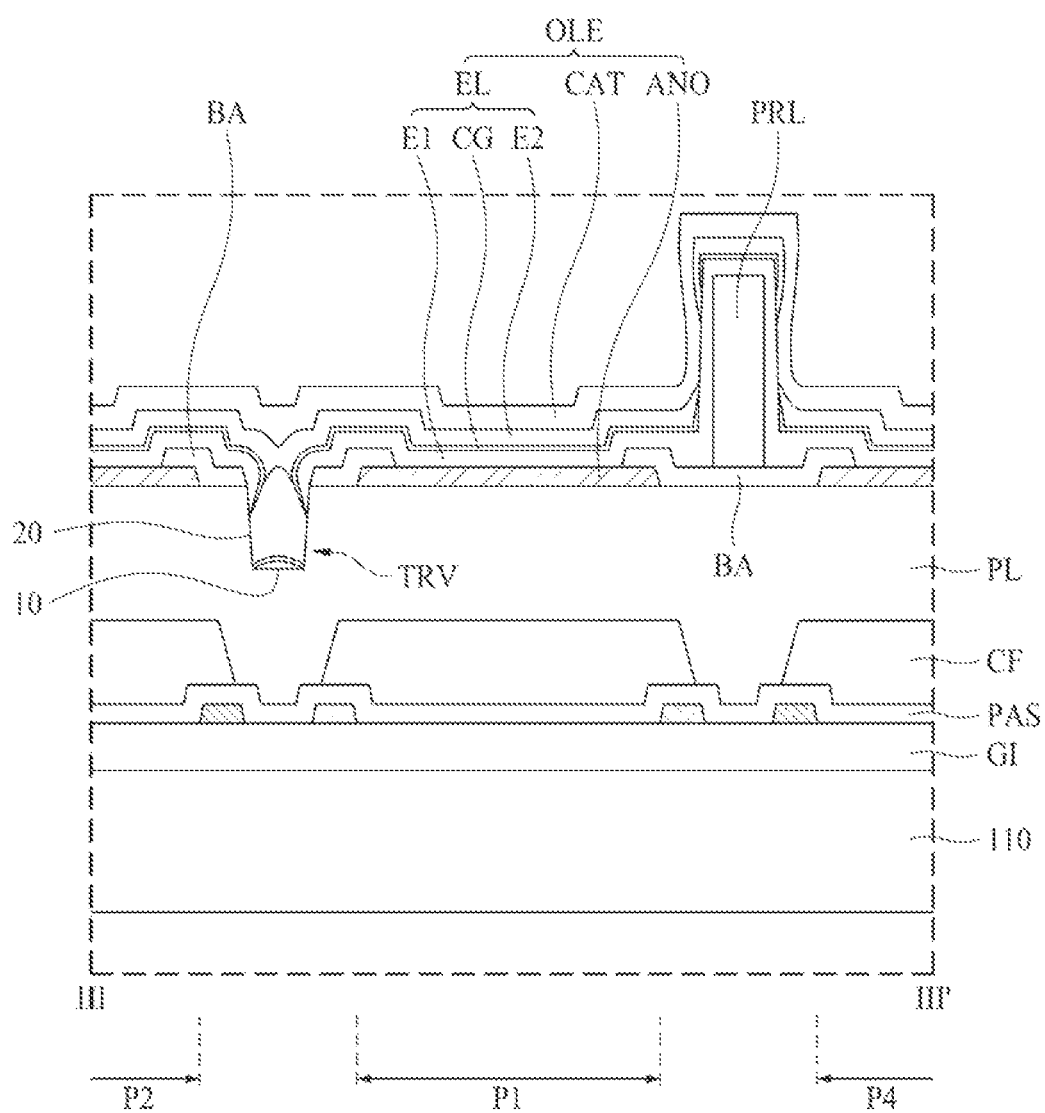
FIG. 12 is a cross-sectional view illustrating a structure of an electroluminescence display according to a fourth embodiment of the present disclosure.

Hereinafter, referring to FIG. 12, the fourth embodiment will be explained. FIG. 12 is a cross-sectional view illustrating a structure of an electroluminescence display according to the fourth embodiment of the present disclosure.

In the third embodiment, the protrusion pillar PRL disposed at the corner portion of the pixel P may not cut the physical connectivity of the emission layer EL between neighboring pixels. In an instance of further increased resolution, the size of the pixel can become smaller, and the size ratio of the corner portion with the pixel can increase. In this instance, with the structure described in the third embodiment, due to the connectivity of the emission layer EL in the protrusion pillar PRL, the leakage current can slightly increase.

In order to prevent or reduce leakage current under this condition, it is possible to have a structure that cuts off the connectivity of the emission layer EL physically in the side wall surface of the protrusion pillar PRL.

Referring to FIG. 12, after forming the trench TR, the first emission layer E1 can be deposited on the anode electrode ANO and the bank BA. On the bottom surface 10 of the trench TR, the first emission layer E1 can be stacked. However, on the side-wall surface 20, the first emission layer E1 may not fully deposited, but it can be partially deposited at the top portions of the trench TR. The first emission layer E1 can be deposited on the surface of the substrate 110, but the electrical connection of the first emission layer E1 can be cut, so that it can be separated in pixel unit.

The charge generation layer CG is deposited on the first emission layer E1. On the bottom surface 10 of the trench TR, the charge generation layer CG can be deposited on the first emission layer E1. On the side-wall surface 20, the charge generation layer CG can be partially deposited at the top portions. The charge generation layer CG can be deposited on the surface of the substrate 110, but the electrical connection of the charge generation layer CG can be cut, so that it can be separated in pixel unit.

The second emission layer E2 is deposited on the charge generation layer CG. The second emission layer E2 thickened from the left side and the second emission layer E2 thickened from the right side can contact each other at the top portion of the trench TR. Thus, a cross sectional shape (or profile) of the top space of the trench TR can be filled or closed.

After that, the cathode electrode CAT is deposited on the second emission layer E2. Since the second emission layer E2 has a structure connected between all pixels on the entire surface of the substrate 110, the cathode electrode CAT also has a structure connected between all pixels.

On the other hand, the trench TR is not formed at the intersection portion CRO where the vertical trench TRV and the horizontal trench TRH intersect, but the protrusion pillar PRL stacked on the bank BA can be formed.

The cross-sectional shape of the protrusion pillar PRL formed at the intersection portion CRO can have a vertical tapered structure or a reverse-tapered structure rather than a forward-tapered structure. In the instance of vertical taper structure, the length of the protrusion pillar PRL can be formed to be longer.

With this structure, the first emission layer E1 can have a structure in which it is disconnected from the side wall surface of the protrusion pillar PRL without riding over the protrusion pillar PRL. The charge generation layer CG can be deposited on the first emission layer E1. The charge generation layer CG can also have a structure that is disconnected at the side wall surface of the protrusion pillar PRL. As a result, even between the diagonally adjacent first pixel P1 and the fourth pixel P4 can be not connected but have a physically disconnected structure.

The second emission layer E2 can be deposited on the charge generation layer CG. The second emission layer E2 can also have a structure that is disconnected at the side wall surface of the protrusion pillar PRL. However, it is not limited thereto. For the second emission layer E2, it can have the connection structure at the side wall surface of the protrusion pillar PRL unlike the first emission layer E1 and the charge generation layer CG.

The cathode electrode CAT can be deposited on the second emission layer E2. Since the cathode electrode CAT can have an inorganic material unlike the first emission layer E1, the charge generation layer CG and the second emission layer E2 which are made of organic material, the cathode electrode CAT can have a structure connected between the first pixel P1 and the fourth pixel P4 adjacent to each other in a diagonal direction while passing over the protrusion pillar PRL. In some instances, the cathode electrode CAT can have the disconnection structure at the side wall surface of the protrusion pillar PRL.

Even though the portions of the cathode electrode CAT can be disconnected at the protrusion pillar PRL, since the cathode electrode CAT can be connected between neighboring pixels in the trench TR region, the cathode electrode CAT can be connected through whole of the substrate 110.

In particular, unlike the instance of forming the trench TR at the intersection portion CRO, the charge generation layer CG may not have a short circuit with the cathode electrode CAT, so that light emitting diode EL can always be maintained in normal condition.

The features, structures, effects and so on described in the above examples of the present disclosure are included in at least one example of the present disclosure, and are not limited to only one example. Furthermore, the features, structures, effects and the likes explained in at least one example can be implemented in combination or modification with respect to other examples by those skilled in the art to which this disclosure belongs. Accordingly, contents related to such combinations and variations should be construed as being included in the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
a substrate including a plurality of pixels, the plurality of pixels including a first pixel at a first row and a first column, a second pixel at the first row and a second column, a third pixel at a second row and the first column, and a fourth pixel at the second row and the second column;
a first vertical trench extending in a first direction between the first pixel and the second pixel;
a second vertical trench extending in the first direction between the third pixel and the fourth pixel;
a first horizontal trench extending in a second direction between the first pixel and the third pixel;
a second horizontal trench extending in the second direction between the second pixel and the fourth pixel; and
a protrusion pillar extending in a third direction at an intersection portion of the substrate where the first vertical trench, the second vertical trench, the first horizontal trench, and the second horizontal trench converge.

2. The electroluminescence display according to claim 1, further comprising:
a first emission layer having portions at the first pixel, the second pixel, the third pixel and the fourth pixel, the portions of the first emission layer being disconnected at the first vertical trench, the second vertical trench, the first horizontal trench and the second horizontal trench, and being connected at the protrusion pillar;
a charge generation layer on the first emission layer, and having portions that are disconnected at the first vertical trench, the second vertical trench, the first horizontal trench and the second horizontal trench, and are connected at the protrusion pillar; and
a second emission layer on the charge generation layer, and having portions connected at the first vertical trench, the second vertical trench, the first horizontal trench, the second horizontal trench, and the protrusion pillar.

3. The electroluminescence display according to claim 2, further comprising:
a plurality of first electrodes, each of the plurality of first electrodes at the first pixel, the second pixel, the third pixel and the fourth pixel; and
a second electrode disposed on the second emission layer, and having portions connected over the first vertical trench, the second vertical trench, the first horizontal trench, the second horizontal trench, and the protrusion pillar.

4. The electroluminescence display according to claim 1, wherein the protrusion pillar has a rectangular shape including four sides corresponding to a width of the first vertical trench, the second vertical trench, the first horizontal trench and the second horizontal trench, respectively.

5. The electroluminescence display according to claim 4, wherein the protrusion pillar is a '+' shaped pillar having protrusions with protruding lengths extending in directions of the first vertical trench, the second vertical trench, the first horizontal trench and the second horizontal trench, respectively.

6. The electroluminescence display according to claim 5, wherein a ratio a protruding length from among the protruding lengths in a direction of the first vertical trench from the rectangular shape and a length of the first vertical trench has any one value selected from 1:8 to 0:10, and
wherein a ratio of a protruding length from among the protruding lengths in a direction of the first horizontal trench from the rectangular shape and a length of the first horizontal trench in in a range of 1:8 to 0:10.

7. The electroluminescence display according to claim 1, further comprising:
a plurality of first electrodes, each of the plurality of first electrodes at the first pixel, the second pixel, the third pixel, and the fourth pixel, respectively;
a first emission layer having portions on the first pixel, the second pixel, the third pixel, and the fourth pixel, and the portions of the first emission layer being disconnected at the first vertical trench, the second vertical trench, the first horizontal trench, the second horizontal trench and the protrusion pillar;
a charge generation layer having portions on the first emission layer, and the portions of the charge generation layer being disconnected at the first vertical trench, the second vertical trench, the first horizontal trench, the second horizontal trench and the protrusion pillar;
a second emission layer having portions on the charge generation layer, and the portions of the second emission layer being connected over the first vertical trench, the second vertical trench, the first horizontal trench, the second horizontal trench and the protrusion pillar; and
a second electrode having portions on the second emission layer, and the portions of the second electrode being connected over the first vertical trench, the second vertical trench, the first horizontal trench, the second horizontal trench and the protrusion pillar.

8. An electroluminescence display comprising:
a planarization layer on an entire surface of a substrate;
a first electrode disposed on the planarization layer and including a first side, a second side perpendicular to the first side, and an intersection portion adjacent an intersection of the first side and the second side;
a trench at a periphery of the first electrode and along the first side and the second side, and having a predetermined width;
a protrusion pillar disposed at the intersection portion;
a first emission layer disposed on the first electrode, and having portions disconnected at the trench, and the portions of the first emission layer being connected over the protrusion pillar;
a charge generation layer disposed on the first emission layer, and having portions disconnected at the trench, and the portions of the charge generation layer being connected over the protrusion pillar;
a second emission layer disposed on the charge generation layer, and having portions connected over the trench, and connected over the protrusion pillar; and
a second electrode disposed on the second emission layer, and having portions connected over the trench and the pillar.

9. The electroluminescence display according to claim 8, wherein the charge generation layer is electrically disconnected from the second electrode.

10. The electroluminescence display according to claim 8, wherein the first electrode further includes:
a third side parallel to the first side; and
a fourth side parallel to the second side, and
wherein the trench includes:
a first trench disposed at a periphery of the first side and the third side; and
a second trench disposed at a periphery of the second side and the fourth side.

11. The electroluminescence display according to claim 10, further comprising:
a bank covering the first side, the second side, the third side and the fourth side of the first electrode, and exposing a central portion of the first pixel,
wherein the trench is formed through the bank and into the planarization layer with a predetermined depth.

12. The electroluminescence display according to claim 11, wherein the protrusion pillar is on an upper surface of the bank at the intersection portion.

13. The electroluminescence display according to claim 10, wherein the bank includes:
a first bank; and
a second bank on the first bank.

14. The electroluminescence display according to claim 8, wherein the first electrode further includes:
a third side parallel to the first side; and
a fourth side parallel to the second side, and
wherein the trench includes:
a first trench at a periphery of the first side and corresponding to the first side;
a second trench at a periphery of the second side and corresponding to the second side;
a third trench at a periphery of the third side and corresponding to the third side; and
a fourth trench at a periphery of the fourth side and corresponding to the fourth side, wherein the protrusion pillar includes four sides corresponding to the predetermined width of the trench at the intersection portion.

15. The electroluminescence display according to claim 10, wherein the protrusion pillar has a '+' shaped pillar protruding toward the first side and the second side from the intersection portion.

16. The electroluminescence display according to claim 10, wherein a ratio of a first protrusion length protruding from the protrusion pillar at one end of the first trench toward the first trench:a length of the first trench:a second protrusion length protruding from the protrusion pillar disposed at another other end of the first trench toward the first trench is in a range of 1:8:1 to 0:10:0.

17. An electroluminescence display comprising:
a planarization layer on a substrate;
a first electrode on the planarization layer, and including a first side, a second side perpendicular to the first side, and an intersection portion at a crossing of the first side and the second side;
a trench at a periphery of the first side and the second side, and having a predetermined width;
a protrusion pillar at a periphery of the intersection portion;
a first emission layer on the first electrode, and having portions disconnected at the trench and the protrusion pillar;
a charge generation layer on the first emission layer, and having portions disconnected at the trench and the protrusion pillar;
a second emission layer on the charge generation layer; and
a second electrode on the second emission layer, and having portions connected over the trench and the protrusion pillar.

18. The electroluminescence display according to claim 17, wherein the portions of the second emission layer are connected over the trench, and are disconnected at the protrusion pillar.

19. The electroluminescence display according to claim 17, wherein the portions of the second emission layer are connected over the trench and the protrusion pillar.

20. The electroluminescence display according to claim 2, further comprising a void present in at least one of the first vertical trench, the second vertical trench, the first horizontal trench, and the second horizontal trench, wherein the void is covered by the second emission layer.

* * * * *